(12) United States Patent
Takiar et al.

(10) Patent No.: US 7,795,715 B2
(45) Date of Patent: Sep. 14, 2010

(54) LEADFRAME BASED FLASH MEMORY CARDS

(75) Inventors: Hem Takiar, Fremont, CA (US); Shrikar Bhagath, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/363,311

(22) Filed: Jan. 30, 2009

(65) Prior Publication Data

US 2009/0134502 A1 May 28, 2009

Related U.S. Application Data

(62) Division of application No. 11/321,350, filed on Dec. 29, 2005, now Pat. No. 7,488,620.

(51) Int. Cl.
*H01L 23/02* (2006.01)

(52) U.S. Cl. ............... 257/679; 257/666; 257/676; 257/E23.064; 257/E23.176

(58) Field of Classification Search ............ 438/25–26, 438/33, 51, 55, 68, 112–113, 123–127; 257/666–679, 257/E23.064, E23.176
See application file for complete search history.

(56) References Cited

U.S. PATENT DOCUMENTS

| 5,652,185 | A | 7/1997 | Lee |
| 6,858,470 | B1 | 2/2005 | Han et al. |
| 2004/0259291 | A1 * | 12/2004 | Takiar ..................... 438/113 |
| 2005/0133890 | A1 | 6/2005 | Liao et al. |
| 2007/0099340 | A1 | 5/2007 | Takiar et al. |
| 2007/0155046 | A1 | 7/2007 | Takiar |

FOREIGN PATENT DOCUMENTS

| KR | 20020007877 A | 1/2002 |
| WO | 0178140 A | 10/2001 |

OTHER PUBLICATIONS

International Search Report dated Jul. 27, 2007 in PCT Application No. PCT/US2006/049383.
International Preliminary Report and Written Opinion dated Jul. 10, 2008 in PCT Application No. PCT/US2006/049383.
Chinese Office Action received Sep. 17, 2009 in Chinese Patent Application No. 200680049955.X.
Amended claims in Response to Chinese Office Action filed Dec. 3, 2009 in Chinese Patent Application No. 200680049955.X.
Office Action dated Mar. 10, 2010 in Chinese Patent Application No. 200680049955.X.
Office Action dated Apr. 2, 2010 in Taiwanese Patent Application No. 095149569.

* cited by examiner

*Primary Examiner*—Dung A. Le
(74) *Attorney, Agent, or Firm*—Vierra Magen Marcus & DeNiro LLP

(57) ABSTRACT

A leadframe design for forming leadframe-based semiconductor packages having curvilinear shapes is disclosed. The leadframes may each include one or more curvilinear slots corresponding to curvilinear edges in the finished and singulated semiconductor package. After encapsulation, the integrated circuit packages on the panel may be singulated by cutting the integrated circuits from the leadframe panel into a plurality of individual integrated circuit packages. The slots in the leadframe advantageously allow each leadframe to be singulated using a saw blade making only straight cuts.

13 Claims, 6 Drawing Sheets

LEADFRAME BASED FLASH MEMORY CARDS

CLAIM OF PRIORITY

This application is a divisional application of U.S. patent application Ser. No. 11/321,350 entitled "METHOD OF FABRICATING LEADFRAME BASED FLASH MEMORY CARDS INCLUDING SINGULATION BY STRAIGHT LINE CUTS," filed Dec. 29, 2005, which is incorporated herein by reference in its entirety.

BACKGROUND OF THE INVENTION

1. Field of the Invention

Embodiments of the present invention relate to a flash memory card including an integrated circuit package including a leadframe having a non-linear or curvilinear outline.

2. Description of the Related Art

As the sizes of electronic devices continue to decrease, the associated semiconductor packages that operate them are being designed with smaller form factors, lower power requirements and higher functionality. Currently, sub-micron features in semiconductor fabrication are placing higher demands on package technology including higher lead counts, reduced lead pitch, minimum footprint area and significant overall volume reduction.

One branch of semiconductor packaging involves the use of a leadframe, which is a thin layer of metal on which one or more semiconductor die are mounted and supported. The leadframe includes electrical leads for communicating electrical signals from the one or more semiconductors to a printed circuit board or other external electrical devices. FIG. 1 shows a leadframe 20 before attachment of a semiconductor die 22. A typical leadframe 20 may include a number of leads 24 having first ends 24a for attaching to semiconductor die 22, and a second end (not shown) for affixing to a printed circuit board or other electrical component. Leadframe 20 may further include a die attach pad 26 for structurally supporting semiconductor die 22 on leadframe 20. While die attach pad 26 may provide a path to ground, it conventionally does not carry signals to or from the semiconductor die 22. In certain leadframe configurations, it is known to omit die attach pad 26 and instead attach the semiconductor die directly to the leadframe leads in a so-called chip on lead (COL) configuration.

Semiconductor leads 24 may be mounted to die attach pad 26 as shown in FIG. 2 using a die attach compound. Semiconductor die 22 is conventionally formed with a plurality of die bond pads 28 on at least first and second opposed edges on the top side of the semiconductor die. Once the semiconductor die is mounted to the leadframe, a wire bond process is performed whereby bond pads 28 are electrically coupled to respective electrical leads 24 using a delicate wire 30. The assignment of a bond pad 28 to a particular electrical lead 24 is defined by industry standard specification. FIG. 2 shows less than all of the bond pads 28 being wired to leads 24 for clarity, but each bond pad may be wired to its respective electrical lead in conventional designs. It is also known to have less than all of the bond pads wired to an electrical lead as shown in FIG. 2.

Typically, leadframe 20 is initially formed from a panel including a plurality of such leadframes. The semiconductor die 22 are mounted and electrically connected to each leadframe in the panel, and the integrated circuits formed thereby are encapsulated in a molding compound. Thereafter, the individual encapsulated integrated circuits are cut from the panel, or singulated, into a plurality of semiconductor packages.

Some conventional substrate-based packages and cards have curvilinear-shaped footprints. As one example, the industry standard Transflash flash memory card, introduced by SanDisk Corporation of Sunnyvale, Calif., is shown in top view and bottom view in FIGS. 3 and 4, respectively. As seen therein, Transflash card 30 includes a generally rectangular shape having sides 32 through 38 joined by rounded corners. Side 32 of the card includes a notch 40 and an angled recessed section 42 defined in an upper portion of side 32 so that the top edge 34 of card 30 is narrower than the bottom edge 38 of the card. Other memory cards, such as for example, a secure digital ("SD") card and a Micro SD card similarly include a curvilinear shape having rounded edges, notches, and/or a chamfer.

Several methods are known for cutting semiconductor packages having curvilinear shaped edges from a panel of encapsulated integrated circuits. Known cutting methods include, for example, water jet cutting, laser cutting, water guided laser cutting, dry media cutting and diamond coated wire cutting. Such cutting methods are able to achieve sophisticated rectilinear and/or curvilinear shapes of the individualized integrated circuit packages. A more detailed description of methods for cutting encapsulated integrated circuits from a panel, and the shapes which may be achieved thereby, is disclosed in published U.S. Patent Application No. 2004/0259291, entitled "Method for Efficiently Producing Removable Peripheral Cards," which application is assigned to the owner of the present invention and which application is incorporated by reference herein in its entirety.

While known cutting methods are effective at achieving curvilinear shapes in individualized semiconductor packages, these methods require precision cutting, and add complexity and cost to the semiconductor fabrication process.

SUMMARY OF INVENTION

The present invention, roughly described, relates to a leadframe design, and methods for forming leadframe-based semiconductor packages having curvilinear shapes. A plurality of leadframes may be batch processed on a panel in a known fabrication process, such as for example, chemical etching or in a mechanical stamping process using progressive dies. The leadframes may each include one or more curvilinear edges corresponding to curvilinear edges in the finished and singulated semiconductor package.

During the package fabrication process, one or more semiconductor die are mounted and electrically connected to the leadframes to form integrated circuits. Thereafter, the integrated circuits are encapsulated in molding compound. After encapsulation, the integrated circuits may be singulated by cutting the integrated circuits from the leadframe panel into a plurality of individual integrated circuit packages. The slots in the leadframe advantageously allow each leadframe to be singulated using a saw blade making only straight cuts. Sawing is generally less expensive, less time consuming and requires less equipment than other cutting methods such as for example water jet cutting, laser cutting often used to achieve curvilinear cutting shapes.

The curvilinear shaped slots allow the singulated package to have curvilinear shaped edges, even though cuts are made only along straight cut lines. The slots may be provided in a variety of configurations to allow the finished package to have any curvilinear shape as desired. Any curvilinear shape may be achieved using a slot having at least two points which intersect one or more of the straight cut lines.

In a further embodiment, instead of sawing, a leadframe may be punched from the leadframe panel. In such embodiments, a single slot may extend substantially around the entire periphery of a leadframe and encapsulated semiconductor package. In such an embodiment, the leadframe may be connected to the panel by a series tie bars at locations spaced around the periphery of the leadframe package.

After the leadframe package is separated by cutting or punching, the edges of the package may be rough and/or fragments of metal from the leadframe may be left attached. Accordingly, after the package is separated by cutting or punching, a known deburring process may be performed to smooth out any rough edges and/or fragments of metal left after the leadframe is singulated.

DETAILED DESCRIPTION

The embodiments of the present invention will now be described with reference to FIGS. 5 through 15, which generally relate to a leadframe design and a method of forming a singulated semiconductor die package having curvilinear shaped edges. As used herein, curvilinear shapes include curved edges, curvilinear shaped edges, non-straight edges and discontinuous edges (i.e., two edges that come together at an oblique angle). It is understood that the present invention may be embodied in many different forms and should not be construed to being limited to the embodiments set forth herein. Rather, these embodiments are provided so that this disclosure will be thorough and complete and will fully convey embodiments of the invention to those skilled in the art. Indeed, the invention is intended to cover alternatives, modifications and equivalents of these embodiments, which are included within the scope and spirit of the invention as defined by the appended claims. Furthermore, in the following detailed description of embodiments of the present invention, numerous specific details are set forth in order to provide a thorough understanding of the present invention. However, it will be clear to those with ordinary skill in the art that the present invention may be practiced without such specific details.

Figure 5:
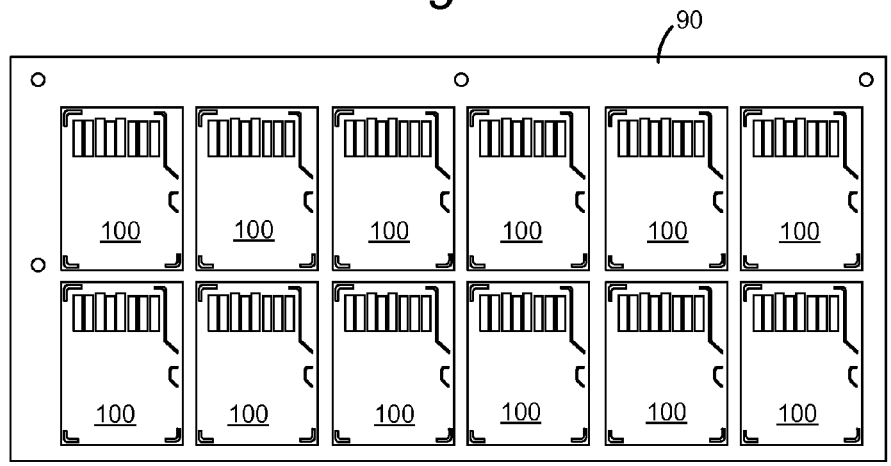
FIG. 5 is a panel including a plurality of leadframes according to an embodiment of the present invention.

In general, leadframes according to the present invention would be batch processed from a panel of leadframes, such as for example panel 90 shown in FIG. 5. In the embodiment shown in FIG. 5, the panel 90 includes a two by six array of leadframes 100. It is understood that panel 90 may be formed in a wide variety of arrays of varying columns and rows in alternative embodiments. As explained hereinafter, integrated circuits are formed on the plurality of leadframes 100 in panel 90, the integrated circuits are encapsulated in a protective molding compound, and then the encapsulated integrated circuits are cut from the panel, or singulated, to form a plurality of semiconductor packages.

Figure 6:
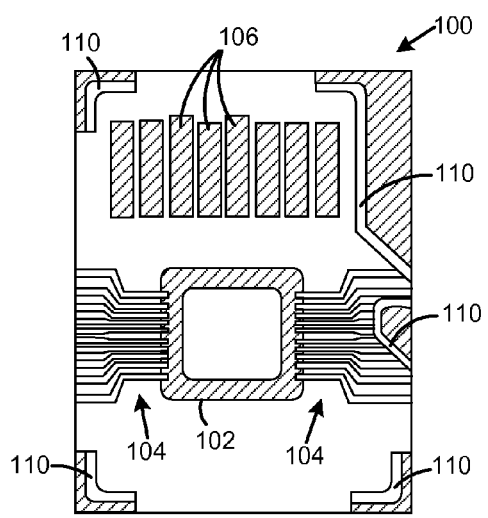
FIG. 6 is a top view of a single leadframe according to an embodiment of the present invention from the panel shown in FIG. 5.

Referring now to FIG. 6, there is shown a single leadframe 100 from panel 90. Leadframe 100 includes a die paddle 102 for supporting one or more semiconductor die. Leadframe 100 further includes electrical leads 104 for communicating electrical signals to and from one or more semiconductor die, and contact pads 106 for transferring electrical signals between the one or more semiconductor die and an external electronic device. Leadframe 100 may also include a plurality of curvilinear shaped slots 110 as explained in greater detail hereinafter.

Leadframe 100 may be formed of a planar or substantially planar piece of metal, such as copper or copper alloys, plated copper or plated copper alloys, Alloy 42 (42Fe/58Ni), or copper plated steel. Leadframe 100 may be formed of other metals and materials known for use in leadframes. In embodiments, leadframe 100 may also be plated with silver, gold, nickel palladium, or copper.

Leadframe 100 including slots 110 may be formed by known fabrication processes, such as for example, chemical etching. In chemical etching, a photoresist film may be applied to the leadframe. A pattern photomask containing the outline of the die paddle 102, electrical leads 104, contact pads 106 and slots 110 may then be placed over the photoresist film. The photoresist film may then be exposed and developed to remove the photoresist from areas on the conductive layers that are to be etched. The exposed areas are next etched away using an etchant such as ferric chloride or the like to define the pattern in the leadframe 100. The photoresist may then be removed. Other known chemical etching processes are known.

The leadframe 100 may alternatively be formed in a mechanical stamping process using progressive dies. As is known, mechanical stamping uses sets of dies to mechanically remove metal from a metal strip in successive steps.

Figure 7:
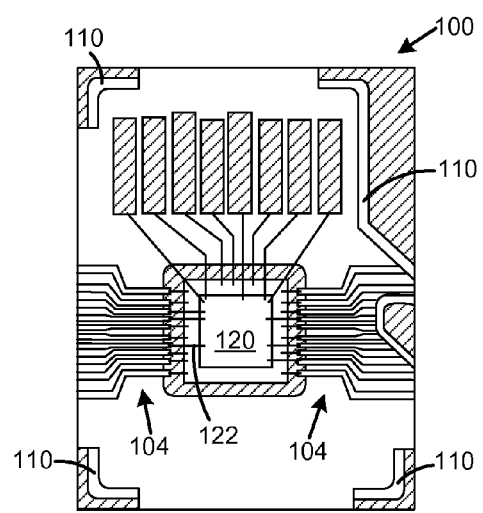
FIG. 7 is a top view of a leadframe according to an embodiment of the present invention including semiconductor die mounted thereon.

Referring now to FIG. 7, after formation of the leadframe, one or more semiconductor die 120 may be mounted to the die paddle 102 of leadframe 100 to form an integrated circuit. In embodiments where leadframe 100 is used in a Transflash flash memory card, the semiconductor die 120 may include flash memory chips (NOR/NAND) and a controller chip such as an ASIC. However, it is understood that the leadframe 100 may be used in a variety of semiconductor packages having curvilinear shaped edges, and a variety of different semiconductor chips and components may be included within the semiconductor package formed from leadframe 100 and semiconductor die 120. The one or more semiconductor die 120 may be mounted to leadframe 100 in a known manner using a dielectric die attach compound, film or tape. In embodiments including a plurality of die, the die may be wire bonded to each other using a known wire bond techniques. Once semiconductor die 120 are fixed to leadframe 100, the die can be wire bonded using wire 122 (FIGS. 7 and 9) to leadframe leads 104 in a known wire bond process.

Figure 8:
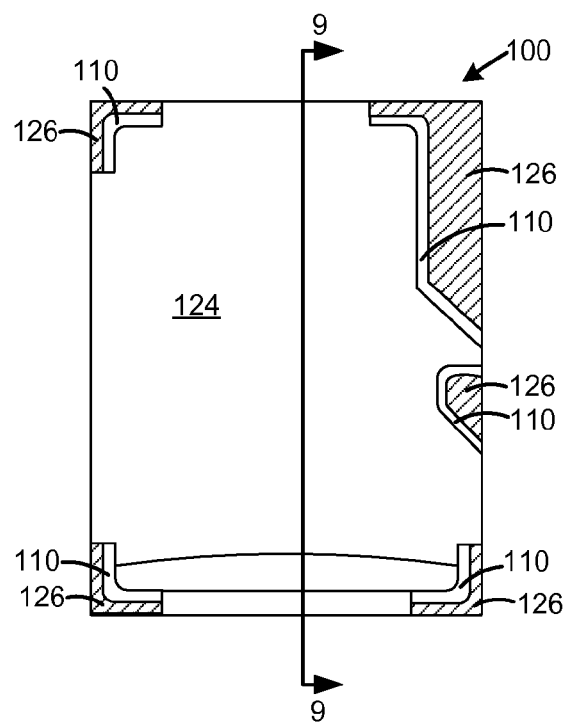
FIG. 8 is a top view of a leadframe according to an embodiment of the present invention including semiconductor die mounted thereon and encapsulated in molding compound.
Figure 9:
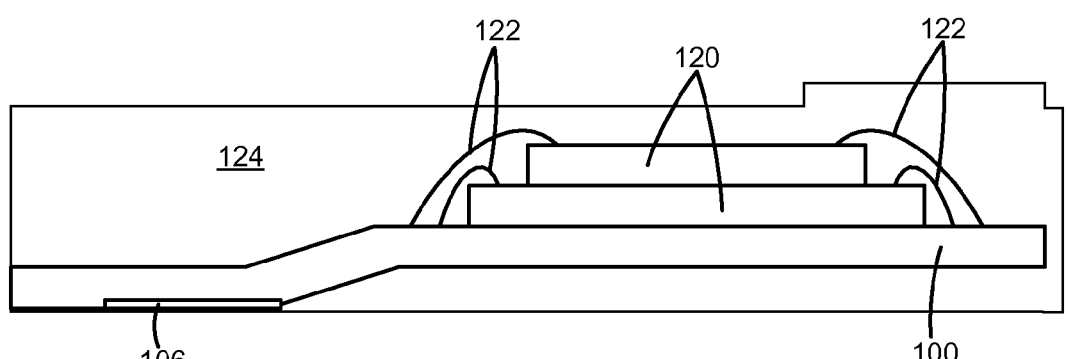
FIG. 9 is a cross-sectional view through a plane along line 9-9 in FIG. 8.

Once the plurality of integrated circuits have been formed on panel 90, each of the integrated circuits may be encapsulated with a molding compound 124 as shown in FIGS. 8 and 9. Molding compound 124 may be an epoxy such as for example available from Sumitomo Corp. and Nitto Denko Corp., both having headquarters in Japan. Other molding compounds from other manufacturers are contemplated. The molding compound may be applied according to various processes, including by transfer molding or injection molding techniques to form an encapsulation on panel 90 encompassing all of the integrated circuits.

In such processes, a panel 90 may be put into a mold having an upper and lower die, or mold caps. As shown in FIG. 8, portions 126 of the leadframe surrounding the curvilinear shaped slots 110 may be left free of molding compound. This molding compound pattern may be achieved by forming a mirror pattern in the upper mold cap. That is, the upper mold cap is formed with a pattern having areas that contact the panel 90 at portions 126 during the encapsulation process to prevent mold compound from depositing on portions 126.

After the molding step, a marking can be applied to the molding compound 124. The marking may for example be a logo or other information printed on the surface of the molding compound for each integrated circuit. The marking may for example indicate manufacturer and/or type of device. The step of marking is not critical to the invention and may be omitted in alternative embodiments.

As seen in the cross-sectional view of FIG. 9, the leadframe 100 may be formed in two planes. A first portion of the leadframe 100 including contact pads 106 may lie in a plane at the bottom of the encapsulated package. Contact pads 106 may be exposed to the external environment surround the encapsulated package to allow electrical connection between the package and an external electrical device. A second portion of the leadframe supporting the one or more semiconductor devices 120 may be spaced from a bottom of the encapsulated package to provide molding compound beneath the semiconductor devices 120 as support for the devices 120. It is understood that the leadframe may lie in a single plane near the bottom of the encapsulated package in alternative embodiments.

After encapsulation and marking, each of the encapsulated integrated circuits in panel 90 may then be singulated, by cutting the integrated circuits in panel 90 into a plurality of individual integrated circuit packages. As used herein, the term cutting is used to refer to cutting, sawing, punching or other methods used to separate the integrated circuits into individual integrated circuit packages. The slots 110 advantageously allow each leadframe 100 to be singulated using a saw blade making only straight cuts. Sawing is generally less expensive, less time consuming and requires less equipment than other cutting methods such as for example water jet cutting, laser cutting often used to achieve curvilinear cutting shapes.

However, it is understood that the leadframe 100 may be singulated by a variety of cutting methods in alternative embodiments, such as for example, water jet cutting, laser cutting, water guided laser cutting, dry media cutting, and diamond coated wire. Water can also be used together with laser cutting to help complement or focus its effects. A further description of the cutting of integrated circuits from a panel and the shapes which may be achieved thereby is disclosed in published U.S. Application No. 2004/0259291, entitled, "Method For Efficiently Producing Removable Peripheral Cards," which application is assigned to the owner of the present invention and which application has been incorporated by reference herein in its entirety. It is understood that the singulated integrated circuits may be formed by other processes than that described above in alternative embodiments.

Figure 10:
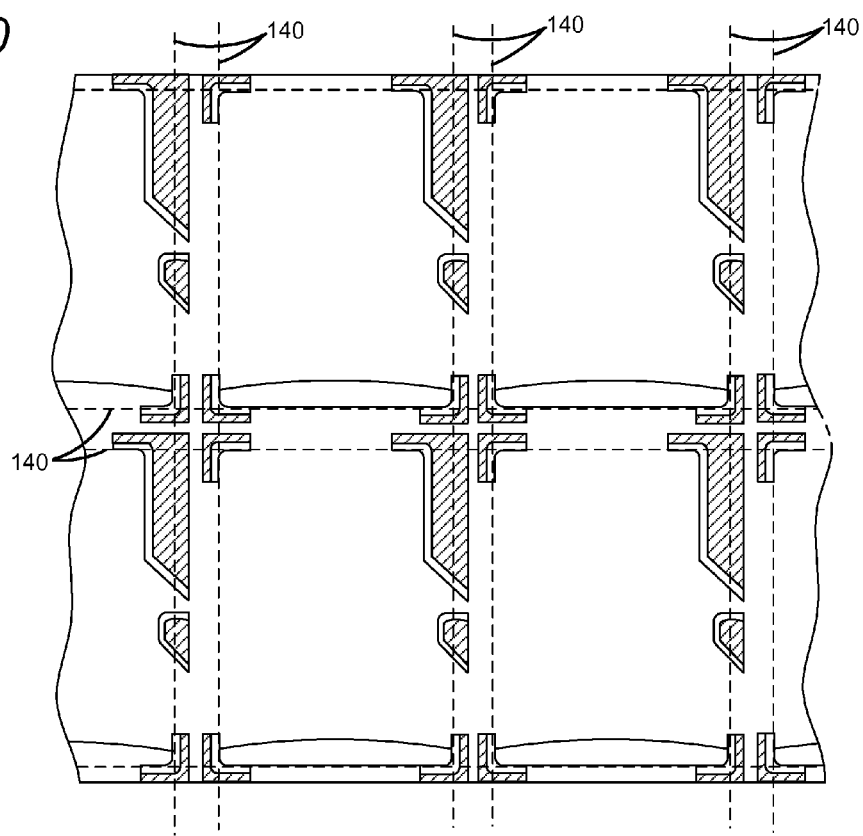
FIG. 10 is a top view of a portion of a leadframe panel according to an embodiment of the present invention showing straight edge cut lines where the finished integrated circuit would be cut to singulate the integrated circuit from the panel of integrated circuits.
Figure 11:
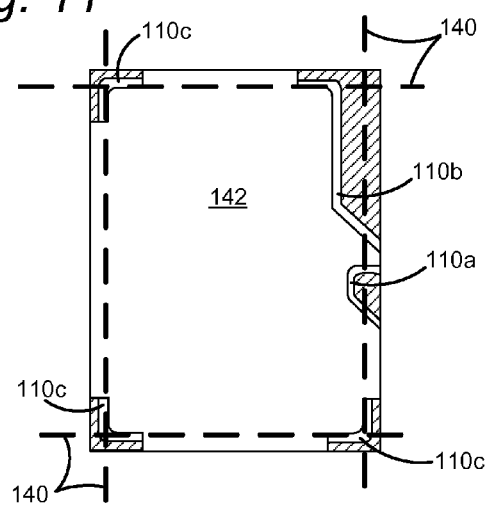
FIG. 11 is a single leadframe from the panel of FIG. 10 showing straight edge cut lines where the finished integrated circuit would be cut to singulate the integrated circuit from the panel of integrated circuits.
Figure 12:
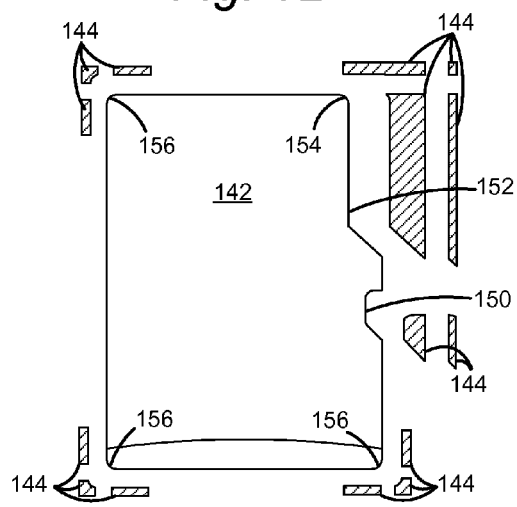
FIG. 12 is a singulated semiconductor package and the cutaway portions of the leadframe to be discarded.

In accordance with the present invention, each integrated circuit may be singulated by cuts may be made along straight reference lines, or cut lines, 140 shown in FIGS. 10 and 11. FIG. 12 is a top view of a singulated integrated circuit package 142, together with leadframe fragments 144 separated from the package 142 and leadframe panel 90 after cuts along straight cut lines 140. As seen in FIG. 12, the curvilinear shaped slots 110 allow the finished package 142 to have curvilinear shaped edges even though cuts are made only along straight cut lines 140. The slots 110 may be provided in a variety of configurations to allow the finished package to have any curvilinear shape as desired. In particular, it is possible to achieve any curvilinear shape using a slot 110 having at least two points which intersect one or more of the straight cut lines 140.

Figure 1:
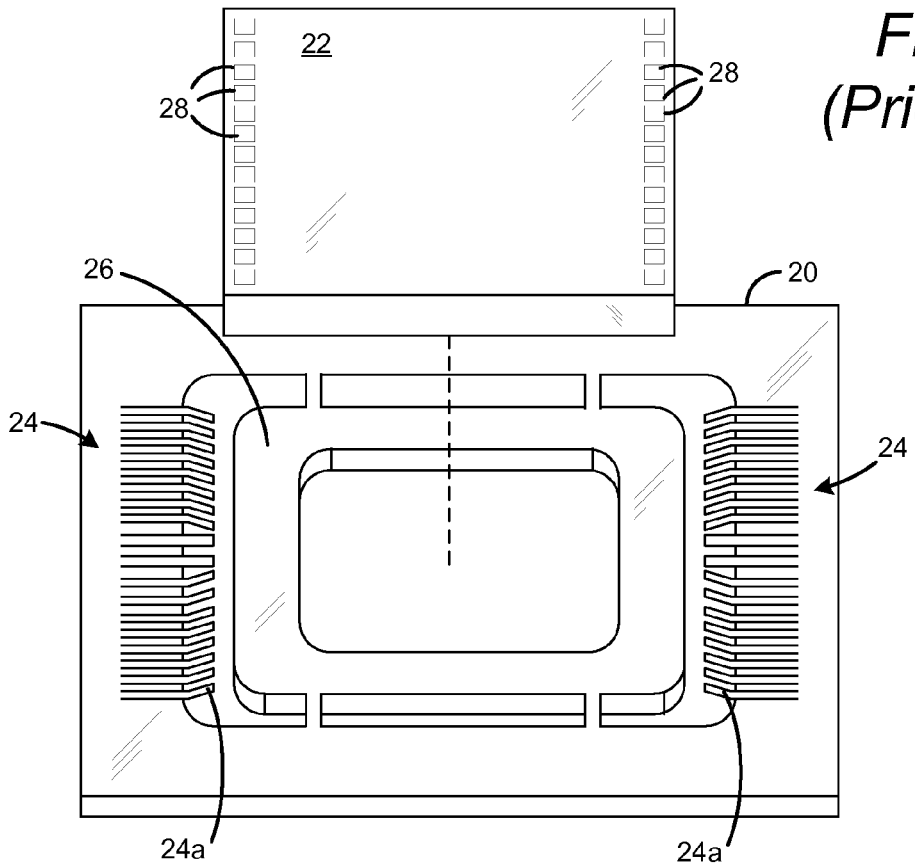
FIG. 1 is an exploded perspective view of a conventional leadframe and semiconductor die.
Figure 2:
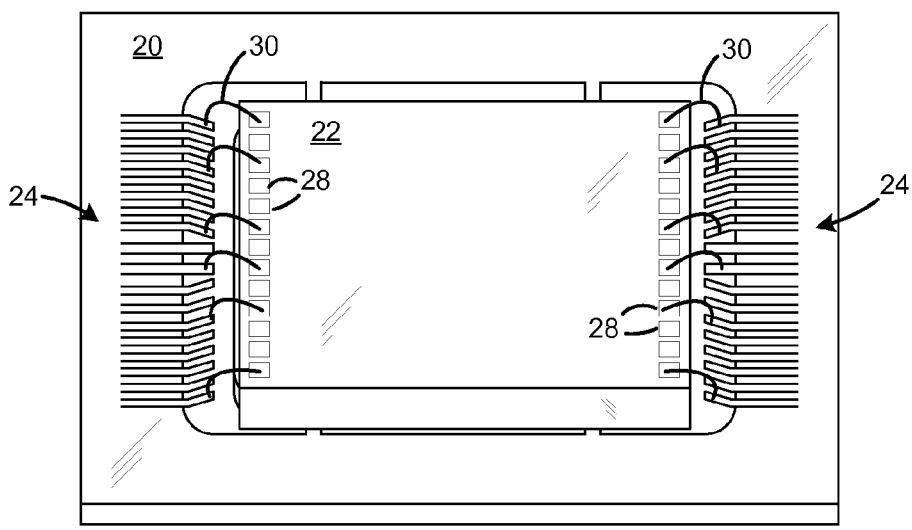
FIG. 2 is a perspective view of a conventional semiconductor die wire bonded to a conventional leadframe.
Figure 3:
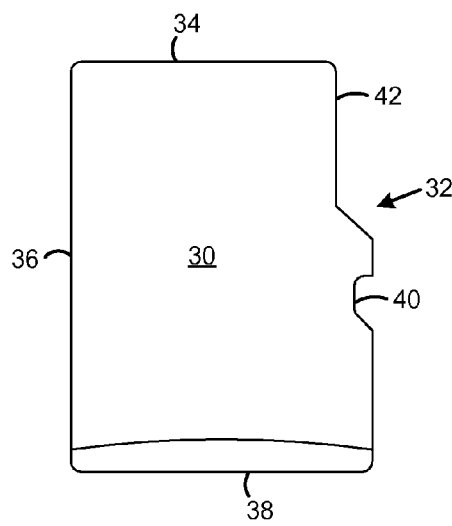
FIG. 3 is a top view of a conventional Transflash memory card.
Figure 4:
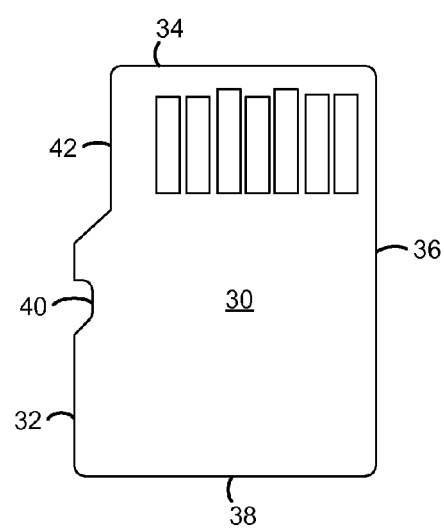
FIG. 4 is a bottom view of a conventional Transflash memory card.

In the embodiment of FIGS. 10 through 12, the semiconductor package 142 may be a Transflash flash memory card. As discussed in the Background of the Invention section, Transflash memory cards include rounded corners, a notch (40, Prior Art FIGS. 3 and 4) and a recessed section (42). In accordance with aspects of the present invention, all of the curvilinear shaped edges in the finished semiconductor package 142 may be defined in the leadframe 100 and package 142 by slots 110. Thus, for example, notch 150 (FIG. 12) in the finished package 142 may be defined by slot 110a (FIG. 11; slots 110a, 110b and 110c are all specific instances of slots 110). The angled recessed section 152 and the upper right hand rounded corner 154 are defined on leadframe 100 and package 142 by slot 110b. And the remaining rounded corners 156 are defined in the leadframe and package by slots 110c. The edges of the leadframe 100 defined by slots 110 form part of the outer edge of the leadframe 100 and package 142 when cuts are made along cut lines 140.

The slots 110 may be any width formable by etching or stamping methods, for example 50 μm or larger. The slots 110 may extend around a periphery of the leadframe 100 in areas not lying on a straight cut line 140. However, one or more of the slots may lie along a portion of a cut line 140 in embodiments. Moreover, in the above-described embodiments, cut lines 140 have a rectangular footprint, and all curvilinear shaped edges in package 142 are formed by slots 110. However, in alternative embodiments, it is understood that some of the curvilinear shaped edges in package 142 may be formed by slots 110, and others of the curvilinear shaped edges in package 142 be formed by cutting through the leadframe 100, for example by water jet cutting, laser cutting, water guided laser cutting, dry media cutting or other methods of making curvilinear shaped cuts.

Figure 13:
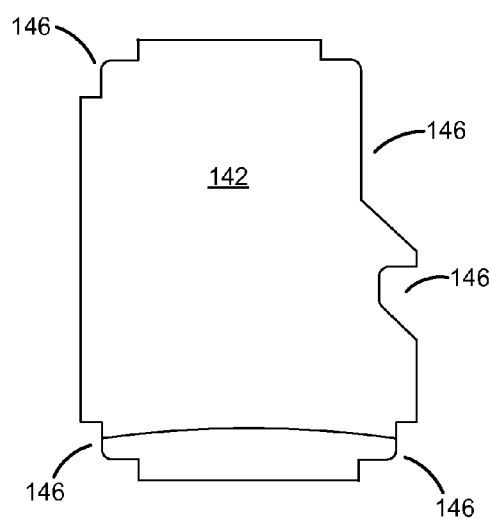
FIG. 13 is a top view of a leadframe according to an alternative embodiment of the present invention.
Figure 14:
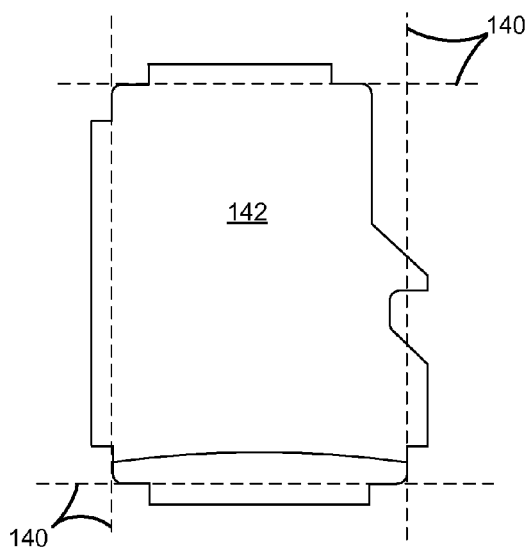
FIG. 14 is a top view of the leadframe of FIG. 13 showing the straight edge cut lines made to singulated the integrated circuit of FIG. 13.

Each of the slots 110 has been described as being defined by two generally parallel edges: an inner edge and an outer edge. The inner edge forms a portion of the outer edge of the finished package 142. The outer edge does not. It is understood that the inner and outer edges of slots 110 need not be parallel to each other in alternative embodiments. For example, FIGS. 13 and 14 show an embodiment where slots 110 are simply cutout sections 146. The inner edge of the cutout sections 146 is the same as for the above-described embodiments (i.e., merely the outer periphery of the package at the curvilinear shaped portions). Thus, when cut along cut lines 140 as shown in FIG. 14 and as described above, the finished shape of the singulated semiconductor package 142 is as described above.

Figure 15:
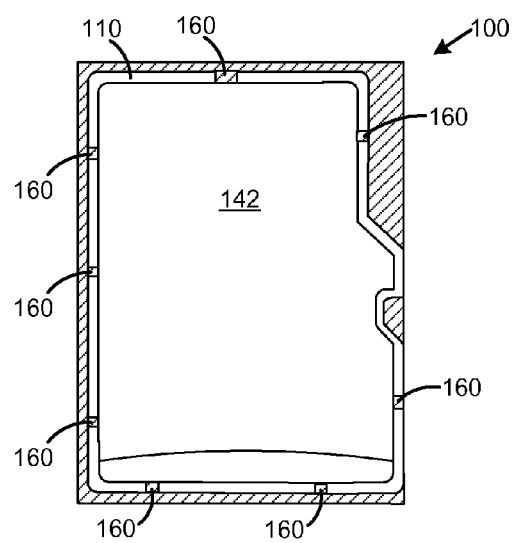
FIG. 15 is a top view of a leadframe according to a further alternative embodiment of the present invention.

A further embodiment of the present invention is shown in FIG. 15. As seen in FIG. 15, slot 110 extends substantially around the entire periphery of leadframe 100 and encapsulated semiconductor package 142. In the embodiment of FIG. 15, the leadframe 100 is connected to the panel 90 by virtue of a plurality of tie bars 160 at locations spaced around the periphery of package 142. It is understood that more or less tie bars may be provided than shown. The leadframe 100 shown in FIG. 15 is well-suited to an embodiment where leadframe 100 is singulated by punching the leadframe from the panel 90. Namely, the package 142 may be singulated by punching the tie bars 160. However, the leadframe of FIG. 15 may be singulated from panel 90 by any cutting method described above in further embodiments.

After the package 142 is separated by cutting or punching, the edges of the package may be rough and/or fragments of metal from the leadframe may be left attached. For example, after the leadframe of FIG. 15 is punched, fragments of tie bars 160 may be left behind. Accordingly, after the package 142 is separated by cutting or punching, a deburring process may be performed to smooth out any rough edges and/or fragments of metal left after the leadframe is cut or punched. The deburring process may be performed by laser, water jet or other known device for smoothing out the edges of the finished package 142.

While embodiments of the invention have been described with respect to a Transflash memory card, it is understood that the present invention may be used for a variety of other semiconductor devices having one or more curvilinear edges, including for example SD cards and Micro SD cards. Other devices are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A leadframe for a semiconductor package, the leadframe formed from a leadframe panel including a plurality of leadframes, the leadframe comprising:
one or more curvilinear slots formed in the leadframe, the curvilinear slot of the one or more curvilinear slots having a first end lying on a first reference line corresponding to a straight edge along which the leadframe is to be cut upon singulation from the leadframe panel, and the slot having a second end lying on a second reference line corresponding to a straight edge along which the leadframe is to be cut upon singulation from the leadframe panel.

2. A leadframe as recited in claim 1, wherein the first reference line and the second reference line correspond to the same straight edge along which the leadframe is to be cut upon singulation from the leadframe panel.

3. A leadframe as recited in claim 1, wherein the first reference line and the second reference line correspond to different straight edges along which the leadframe is to be cut upon singulation from the leadframe panel.

4. A leadframe as recited in claim 1, wherein the first reference line, the slot and the second reference line together define contiguous edges of the semiconductor package.

5. A leadframe as recited in claim 1, wherein the slot defines a corner of the semiconductor package.

6. A leadframe as recited in claim 1, wherein the first reference line is at least substantially orthogonal to the second reference line and the slot defines a rounded corner of the semiconductor package between the first and second reference lines.

7. A leadframe as recited in claim 1, wherein the slot defines a notch within the outer edge of the semiconductor package.

8. A leadframe as recited in claim 1, wherein the slot defines recessed portion within the outer edge of the semiconductor package.

9. A leadframe as recited in claim 1, wherein the leadframe is capable of use in a Transflash flash memory device and the one or more slots define curvilinear edges of the device.

10. A semiconductor package, comprising:
a leadframe including one or more curvilinear slots; and
a semiconductor die affixed to the leadframe;
the semiconductor package formed by the method of:
(a) forming a plurality of leadframes with a plurality of curvilinear slots on a panel;
(b) affixing semiconductor die to the panel;
(c) encapsulating at least portions of the panel in molding compound;
(d) making a plurality of straight line cuts to singulate the semiconductor package, the straight line cuts connecting with the curvilinear slots such that the straight line cuts and the slots define the shape of the outer edges of a singulated semiconductor package.

11. A semiconductor package as recited in claim 10, wherein the semiconductor package is configured for use as a Transflash flash memory device.

12. A semiconductor package as recited in claim 10, wherein the semiconductor package is configured for use as a secure digital flash memory device.

13. A semiconductor package as recited in claim 10 further comprising the step of deburring the semiconductor package after the semiconductor package is singulated from the leadframe.

* * * * *